US008466370B2

(12) United States Patent
Lier

(10) Patent No.: US 8,466,370 B2
(45) Date of Patent: Jun. 18, 2013

(54) LOW INDEX METAMATERIAL

(75) Inventor: Erik Lier, Newtown, PA (US)

(73) Assignee: Lockheed Martin Corporation, Denver, CO (US)

(*) Notice: Subject to any disclaimer, the term of this patent is extended or adjusted under 35 U.S.C. 154(b) by 483 days.

(21) Appl. No.: 12/564,847

(22) Filed: Sep. 22, 2009

(65) Prior Publication Data

US 2010/0078203 A1 Apr. 1, 2010

Related U.S. Application Data

(60) Provisional application No. 61/114,439, filed on Nov. 13, 2008, provisional application No. 61/101,594, filed on Sep. 30, 2008.

(51) Int. Cl.
*H05K 1/00* (2006.01)

(52) U.S. Cl.
USPC .......... 174/258

(58) Field of Classification Search
USPC .......... 174/258; 343/772–773, 783, 785–787
See application file for complete search history.

(56) References Cited

U.S. PATENT DOCUMENTS

| | | | | |
|---|---|---|---|---|
| 6,992,639 | B1 | 1/2006 | Lier | |
| 7,379,030 | B1 | 5/2008 | Lier | |
| 7,623,085 | B1 | 11/2009 | Lier | |
| 7,629,937 | B2 | 12/2009 | Lier et al. | |
| 2005/0225492 | A1 | 10/2005 | Metz | |
| 2007/0188385 | A1 | 8/2007 | Hyde et al. | |
| 2008/0048917 | A1 | 2/2008 | Achour et al. | |
| 2008/0165079 | A1 | 7/2008 | Smith et al. | |
| 2008/0176046 | A1* | 7/2008 | Yamaguchi et al. | 428/195.1 |

OTHER PUBLICATIONS

Lier, "A Dielectric Hybrid Mode Antenna Feed: A Simple Alternative to the Corrugated Horn," IEEE Transactions on Antennas and Propagation, Jan. 1986, pp. 21-29, vol. AP-34, No. 1, IEEE.

Lier et al., "A New Class of Dielectric-Loaded Hybrid-Mode Horn Antennas With Selective Gain: Design and Analysis by Single Mode Model and Method of Moments," IEEE Transactions on Antennas and Propagation, Jan. 2005, pp. 125-138, vol. 53, No. 1, IEEE.

Lier et al., "Simple Hybrid Mode Horn Feed Loaded with a Dielectric Cone," Electronic Letters, 1985, pp. 563-561, No. 21.

* cited by examiner

*Primary Examiner* — Jeremy Norris
*Assistant Examiner* — Tremesha S Willis
(74) *Attorney, Agent, or Firm* — McDermott Will & Emery LLP

(57) ABSTRACT

Various aspects of the disclosure provide low index metamaterials. The low index metamaterials may be used to form soft and/or hard electromagnetic (EM) boundaries to facilitate desired EM performance or propagation in applications including feed horns, spatial feed/combiners, isolation barriers between antennas or RF modules, and reduced radar cross-section applications. In one aspect, a low index metamaterial comprises a dielectric layer and a plurality of conductors on a surface of the dielectric layer, embedded in the dielectric layer or both, wherein the low index metamaterial appears as a medium having a dielectric constant less than one with respect to electromagnetic waves at predetermined frequencies and propagating at grazing angles with respect to a surface of the low index metamaterial.

19 Claims, 17 Drawing Sheets

LOW INDEX METAMATERIAL

RELATED APPLICATIONS

The present application claims the benefit of priority under 35 U.S.C. §119 from U.S. Provisional Patent Application Ser. No. 61/114,439, entitled "IMPLEMENTATION OF LOW INDEX METAMATERIAL BOUNDARY," filed on Nov. 13, 2008, and U.S. Provisional Patent Application Ser. No. 61/101,594, entitled "LOW INDEX METAMATERIAL BOUNDARY," filed on Sep. 30, 2008, both of which are hereby incorporated by reference in their entirety for all purposes.

STATEMENT REGARDING FEDERALLY SPONSORED RESEARCH OR DEVELOPMENT

Not Applicable.

FIELD OF THE INVENTION

The present invention relates generally to metamaterials, and more particularly to low index metamaterials.

BACKGROUND OF THE INVENTION

Electromagnetic Band Gap ("EBG") structures, soft and hard electromagnetic ("EM") surfaces, and other EM surfaces represent boundaries that can facilitate desired EM wave performance or propagation for applications such as spatial filtering, suppression of surface waves, support of surface radiation and diffraction suppression. These boundaries can be implemented using large scale periodic structures (1/5 to 1/10 wavelength), such as corrugations, strip-loaded dielectric liners and dielectric/metal multilayer liners. However, these structures are inherently band-limited and often expensive to manufacture and implement.

SUMMARY OF THE INVENTION

Various aspects of the disclosure provide low index metamaterials. The low index metamaterials may be used to form soft and/or hard electromagnetic (EM) boundaries to facilitate desired EM performance or propagation in applications including feed horns, spatial feed/combiners, isolation barriers between antennas or RF modules, and reduced radar cross-section applications.

In an aspect of the disclosure, a low index metamaterial comprises a dielectric layer and a plurality of conductors on a surface of the dielectric layer, embedded in the dielectric layer or both, wherein the low index metamaterial appears as a medium having a dielectric constant less than one with respect to electromagnetic waves at predetermined frequencies and propagating at grazing angles with respect to a surface of the low index metamaterial. The plurality of conductors may comprise a plurality of vias embedded in the dielectric layer and/or a plurality of strips on the surface of the dielectric layer and/or embedded in the dielectric layer.

In another aspect of the disclosure, a hard boundary liner comprises a low index metamaterial including a first dielectric layer and a plurality of conductors on a surface of the dielectric layer, embedded in the dielectric layer or both, wherein the low index metamaterial appears as a medium having a dielectric constant less than one with respect to electromagnetic waves at predetermined frequencies and propagating at grazing angles with respect to a surface of the low index metamaterial. The hard boundary liner further comprises a second dielectric layer overlaying the low index metamaterial.

In yet another aspect of the disclosure, a low index metamaterial comprises a plurality of interconnected wires forming a free-standing three-dimensional grid structure, wherein the low index metamaterial appears as a medium having a dielectric constant less than one with respect to electromagnetic waves at predetermined frequencies and propagating at grazing angles with respect to a surface of the low index metamaterial.

Additional features and advantages of the invention will be set forth in the description below, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

DETAILED DESCRIPTION OF THE INVENTION

Figure 1:
FIG. 1 shows an example of a soft boundary according to an aspect of the disclosure.

FIG. 1 shows an exemplary soft boundary 120 according to an aspect of the disclosure. The soft boundary 120 is formed by a layer of low index metamaterial 110 over a conducting surface 105. In the disclosure, the term "low index" may refer to a material having an index of refraction less than one. The index of refraction may be given by:

$$n=\sqrt{\mu_r \in_r} \quad (1)$$

where n is the index of refraction, $\mu_r$ is relative permeability, and $\in_r$ is the dielectric constant. For ease of discussion, $\mu_r$ will be treated as being approximately equal to one so that a dielectric constant $\in_r$ of less than one in the discussion below corresponds to an index of refraction n of less than one. The dielectric constant may also be referred to as relative permittivity.

In one aspect, the low index metamaterial 110 forming the soft boundary 120 has a dielectric constant given by $$0<\in_r<1 \quad (2)$$

The layer of low index metametrial 110 may have a uniform dielectric constant or a dielectric that varies between zero and one, e.g., along a direction normal to the soft boundary 120.

The soft boundary 120 has boundary impedances approximately given by $$Z^{TE}=Z_x=\frac{E_x}{H_z}=0 \quad (3)$$

$$Z^{TM}=Z_z=-\frac{E_z}{H_x}=\infty \quad (4)$$

where $Z^{TE}$ is transverse electric (TE) mode impedance, $Z^{TM}$ is transverse magnetic (TM) mode impedance, E is an electric field component, and H is a magnetic field component. The orientations of the x and z axis are shown in FIG. 1. The soft boundary 120 forces the electric field intensity at the interface between air and the low index metamaterial 110 to be zero.

Figure 2:
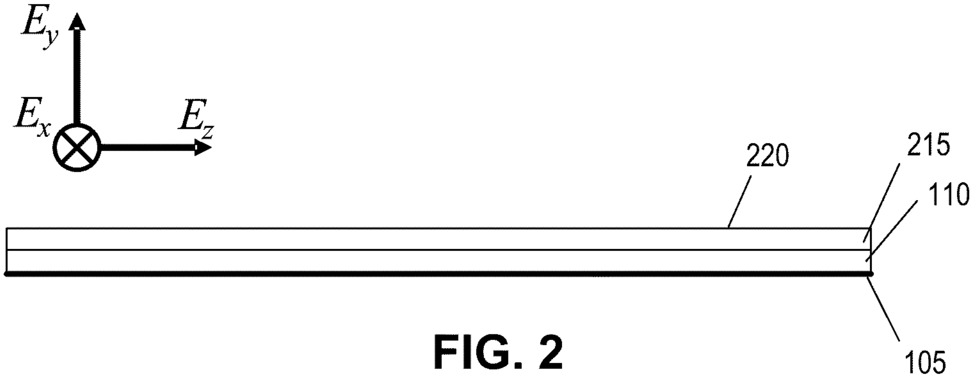
FIG. 2 shows an example of a hard boundary according to an aspect of the disclosure.

FIG. 2 shows an exemplary hard boundary 220 according to an aspect of the disclosure. The hard boundary 220 is formed by a dielectric layer 215 over the low index metamaterial 110. In this aspect, the dielectric layer 215 has a dielectric constant greater than one. The dielectric layer 215 may comprise polyethylene, polystyrene, Teflon, alumina or other dielectric material. The dielectric layer 215 may also comprise metamaterial having a dielectric constant greater than one. The dielectric constants of the dielectric layer 215 and the low index metamaterial 110 are given by $$0<\in_{r1}<1 \quad (5)$$

$$\in_{r2}>1 \quad (6)$$

where $\in_{r1}$ is the dielectric constant of the low index metamaterial 110 and $\in_{r2}$ is the dielectric constant of the dielectric layer 215.

The hard boundary 220 has boundary impedances approximately given by $$Z^{TE}=Z_x=\frac{E_x}{H_z}=\infty \quad (7)$$

$$Z^{TM}=Z_z=-\frac{E_z}{H_x}=0 \quad (8)$$

where $Z^{TE}$ is transverse electric (TE) mode impedance, $Z^{TM}$ is transverse magnetic (TM) mode impedance, E is an electric field component, and H is a magnetic field component. The orientations of the x and z axis are shown in FIG. 2.

Low index metamaterials 110 according to various aspects of the disclosure may be used to form soft and/or hard electromagnetic (EM) boundaries. For example, the low index metamaterial 110 may be used as a liner for a waveguide or horn to facilitate desired EM performance or propagation within the waveguide or horn. The low index metamaterial 110 may also be used to create an isolation barrier between antennas or RF modules. The low index metamaterial 110 may also be used to reduce the radar cross-section of an object to make the object invisible to radar. These and other applications of the low index metamaterial 110 according to aspects of the disclosure are discussed further below.

In this disclosure, it is assumed that an incident electromagnetic field propagates at a grazing or oblique angle to the boundary surface. In other words, the direction of propagation is close to parallel to the surface or close to 90 degrees with the surface normal vector. A grazing angle may be 60 to 90 degrees relative to the surface normal vector.

Figure 3:
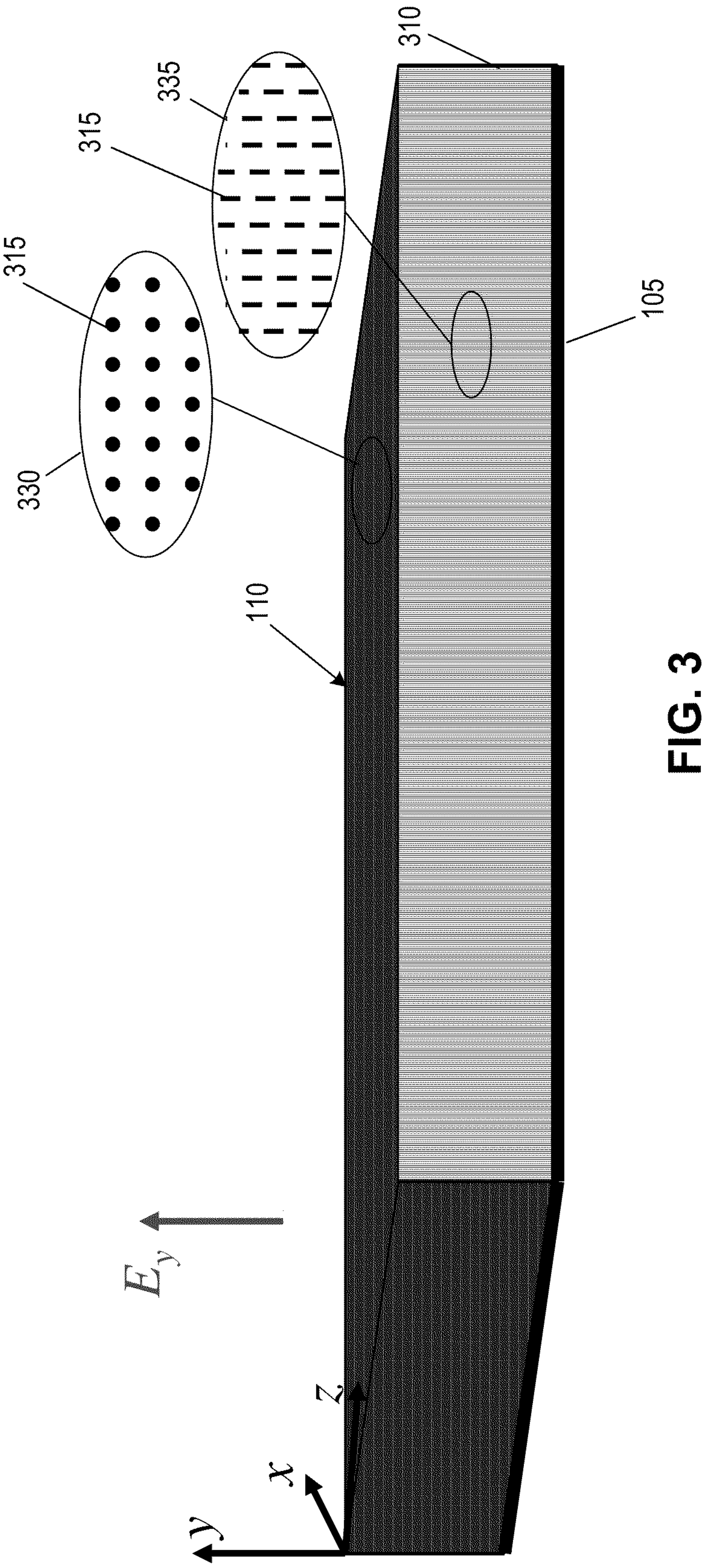
FIG. 3 shows an example of a low index metamaterial comprising vias according to an aspect of the disclosure.

FIG. 3 shows a perspective view of a low index metamaterial 110 according to an aspect of the disclosure. The low index metamaterial 110 comprises a dielectric layer 310 and a plurality of vias 315 embedded in the dielectric layer 310. The dielectric layer 310 may comprise polyethylene, polystyrene, Teflon, alumina or other dielectric material. Each via 315 comprises metal or other conductive material. Examples of metals that may be used for the vias 315 include gold, copper, silver, aluminum and other metals.

In the example shown in FIG. 3, the vias 315 form elongated conductive structures orientated normal to the surface of the low index metamaterial 110. FIG. 3 shows a top view 330 of the vias 315 in the xz plane and a side view 335 of the vias 315 in the yz plane. The vias 315 may penetrate completely through the dielectric layer 310 or partly through the dielectric layer 310. The vias 315 can be continuous in the direction normal to the surface or broken up into a plurality of vias 315 in the direction normal to the surface, as shown in the side view 335. Although, the vias 315 are shown having circular cross-sections in the example in FIG. 3, the vias 315 may have any cross-sectional shape.

In one aspect, the low index metamaterial 110 may have a repeating structure comprising a cell that is repeated throughout or a portion of the low index metamaterial 110.

In one aspect, each via 315 may have a dimension (e.g., width) in the direction of propagation of an electromagnetic wave that is smaller than a wavelength of a frequency of operation. For example, when the low index metamaterial 110 is used as a liner for a waveguide or horn, each via 315 has a dimension in the direction of propagation that is smaller than the wavelength of the maximum frequency of operation of the waveguide or horn. In one aspect, the dimension of each via 315 may be 1/10 or less the wavelength of the maximum frequency of operation. For an example of a maximum frequency of operation of 10 Gigahertz, this translates into a dimension of 3 millimeters or less.

As a result of the small dimension in the direction of propagation, the composite of the dielectric layer 310 and the vias 315 appears as a medium having a low dielectric constant (i.e., $0<\in_r<1$) with respect to an electromagnetic wave at the frequency of operation. The dielectric constant of the metamaterial 110, as seen by the electromagnetic wave, may be a function of the dielectric constant of the dielectric layer 310 and the dimensions and/or arrangement of the vias 315.

The metamaterial 110 may have a dielectric constant that varies along a direction normal to the surface of the metamaterial 110. This may be accomplished by varying the dimensions and/or arrangement of the vias 315 in the dielectric material 310 along the direction normal (y direction in FIG. 3) to the surface of the metamaterial 110. Also, the metamaterial 110 may be flat (shown in the example in FIG. 3) or curved. In addition, the metamaterial 110 may have a constant thickness or a thickness that varies in the xz plane.

For the example of an electromagnetic wave having a transverse polarization normal to the metamaterial 110 surface or boundary, the vias 315 mainly affect the normal component $E_y$ of the electric field and are parallel to the transverse electric field component of the wave.

Figure 4:
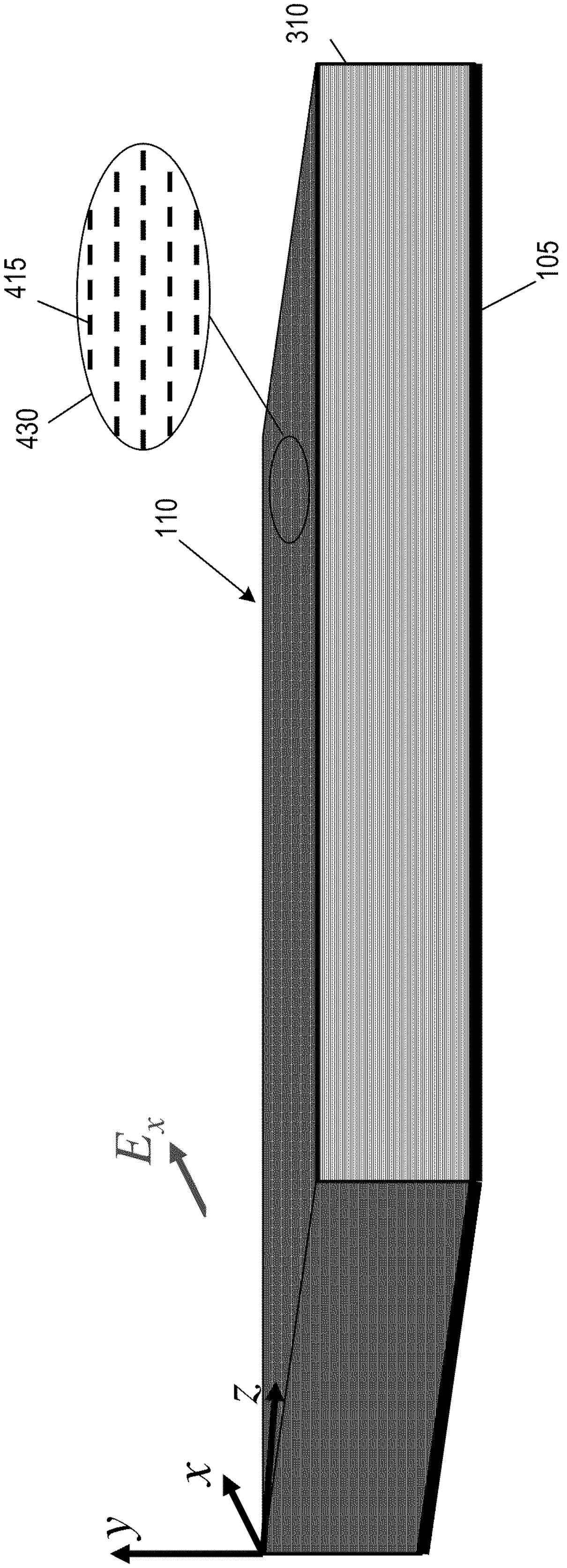
FIG. 4 shows an example of a low index metamaterial comprising strips according to an aspect of the disclosure.

FIG. 4 shows a perspective view of a low index metamaterial 110 according to an aspect of the disclosure. The low index metamaterial 110 comprises a dielectric layer 310 and a plurality of conductive strips 415. In the disclosure, strips 415 may also refer to wires. The conductive strips 415 may be on the surface of the dielectric layer 310 and/or embedded in the dielectric layer 310. The strips 415 may comprise metal or other conductive material. Example of metals that may be used for the strips 415 include gold, copper, silver, aluminum and other metals.

In the example shown in FIG. 4, the strips 415 are orientated parallel to the surface of the low index metamaterial 110. FIG. 4 shows a top view 430 of the strips 415 in the xz plane. The strips 415 may be continuous along a length of the metamaterial 110 or broken up into a plurality of strips 415 along the length of the metamaterial 110, as shown in the example in the top view 430. Although the strips 415 are shown having straight rectangular shapes in FIG. 4, the strips 415 may have other shapes. For example, the strips 415 have bent shapes including L-shapes, U-shapes, S-shapes, or any other shapes. The strips may also be in the shape of microtube patches or square metallic areas.

In one aspect, the low index metamaterial 110 may have a repeating structure comprising a cell that is repeated throughout or a portion of the low index metamaterial 110.

In one aspect, each strip 415 may have a dimension in the direction of propagation of an electromagnetic wave that is smaller than a wavelength of a frequency of operation. For example, when the low index metamaterial 110 is used as a liner for a waveguide or horn, each strip 415 has a dimension in the direction of propagation that is smaller than the wavelength of the maximum frequency of operation of the waveguide or horn. In one aspect, the dimension of each strip 415 may be 1/10 or less the wavelength of the maximum frequency of operation. As a result of the small dimension, the composite of the composite of the dielectric layer 310 and the strips 415 appears as a medium having a low dielectric constant (i.e., $0<\in_r<1$) with respect to an electromagnetic wave at the frequency of operation.

The metamaterial 110 may be flat (shown in the example in FIG. 4) or curved. In addition, the metamaterial 110 may have a constant thickness or a thickness that varies in the xz plane. Further, the strips 415 may all be orientated along the same direction or different directions. For example, some of the strips 415 may be orientated along the z direction and some may be orientated along the x direction.

For the example of an electromagnetic wave having a transverse polarization parallel to the metamaterial 110 surface or boundary, the strips 415 mainly affect the parallel component $E_x$ of the electric field and are parallel to the transverse electric field component of the wave.

Figure 5:
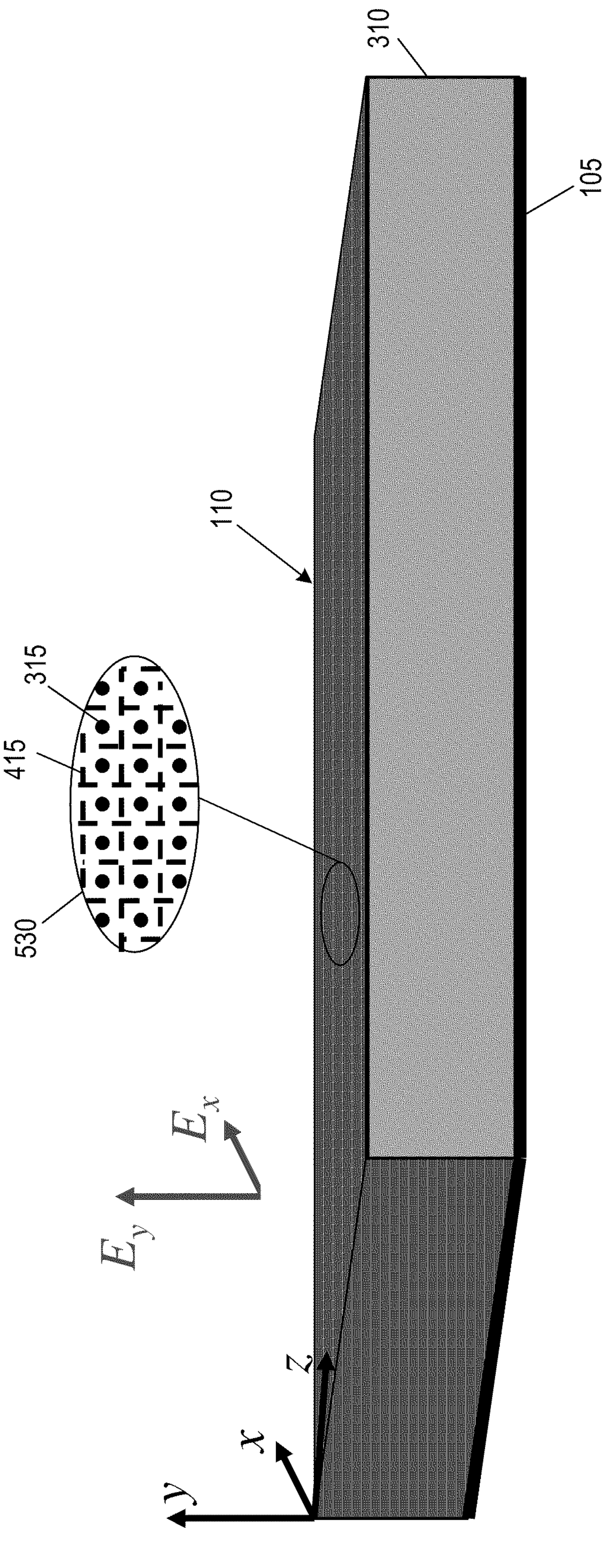
FIG. 5 shows an example of a low index metamaterial comprising strips and vias according to an aspect of the disclosure.

FIG. 5 shows a perspective view of a low index metamaterial 110 according to another aspect of the disclosure. The low index metamaterial 110 comprises a dielectric layer 310 and a plurality of vias 315 and strips 415. The vias 315 may be embedded in the dielectric layer 310 and the strips 415 may be on the surface of the dielectric layer 310 and/or embedded in the dielectric layer 310. The vias 315 and strips 415 may comprise metal or other conductive material.

In the example shown in FIG. 5, the vias 315 are normal to the surface of the metamaterial 110 and the strips 415 are parallel to the surface of the metamaterial 110. FIG. 5 shows a top view 530 of the vias 315 and the strips 415 in the xz plane. The vias 315 may penetrate completely through the dielectric layer 310 or partly through the dielectric layer 310. The strips 415 may be continuous along a length of the metamaterial 110 or broken up into a plurality of strips 415 along the length of the metamaterial 110. Further, the strips 415 may be orientated along the same direction or along different directions. The strips 415 may have strait shapes, bent shapes or any other shapes.

In one aspect, the low index metamaterial 110 may have a repeating structure comprising a three-dimensional cell that is repeated throughout or a portion of the low index metamaterial 110. The vias 315 and strips 415 within each cell may have varying thicknesses and/or widths.

In one aspect, each via 315 and strip 415 has a dimension in the direction of propagation that is smaller than the wavelength of a frequency of operation. In this aspect, the dimension of each via 315 and strip 415 may be 1/10 or less the wavelength of the frequency of operation. As a result of the small dimension, the composite of the dielectric layer 310, the vias 315 and the strips 415 appears as a medium having a low dielectric constant (i.e., $0<\in_r<1$) with respect to an electromagnetic wave at the frequency of operation.

The metamaterial 110 may be flat (as shown in the example in FIG. 5) or curved. In addition, the metamaterial 110 may have a constant thickness or a thickness that varies in the xz plane.

For the example of an electromagnetic wave having polarizations both normal and parallel to the metamaterial 110 surface or boundary, the vias 315 and strips 415 affect both the $E_y$ and $E_x$ electric field components. The vias 315 and strips 415 may be oriented in the x, y and z directions to affect all electric field components.

The metamaterial 110 may have a dielectric constant that varies along one or more directions. This may be accomplished, for example, by varying the dimensions and/or arrangement of the vias 315 and/or strips 415 in the dielectric material 310 along the one or more directions. The dielectric constant of the metamaterial 110 may vary continuously along the one or more directions or in a stepwise fashion along the one or more directions. In one aspect, the dielectric constant of the metamaterial 110 may vary along a direction normal to the surface of the metamaterial 110.

Examples of processes that may be used to fabricate the low index metamaterials in FIGS. 3-5 will now be described according to various aspects of the disclosure.

Figure 6:
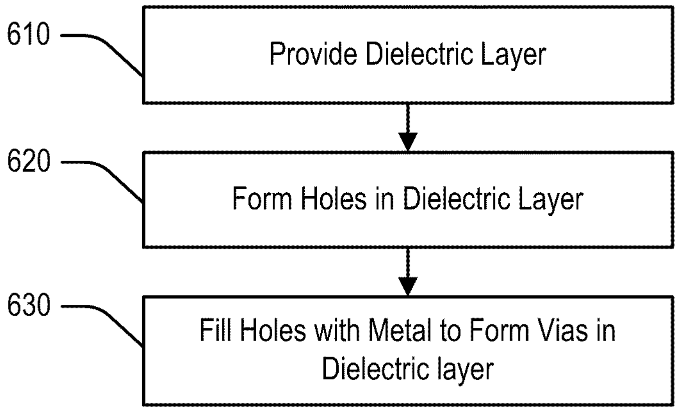
FIG. 6 is a flow diagram illustrating a method for fabricating a low index metamaterial according to an aspect of the disclosure.

FIG. 6 is a flow diagram of a process for fabricating a low index metamaterial 110 with vias 315 according to an aspect of the disclosure.

In step 610, a dielectric layer is provided. The dielectric layer may comprise polyethylene, polystyrene, Teflon, alumina or other dielectric material. In step 620, holes are formed in the dielectric layer. The holes may be formed using a drill (e.g., mechanical drill or laser drill) or other techniques. Each hole may penetrate completely though or partly though the dielectric layer. In step 630, the holes are filled with metal or other conductive material to form the vias 315. For example, the vias 315 may be formed by plating the holes with metal using electroplating or other techniques.

In one aspect, a single dielectric layer with the vias 315 fabricated by the process in FIG. 6 may be used for the low index metamaterial 110. In another aspect, a plurality of dielectric layers with vias 315 fabricated by the process of FIG. 6 may be stacked on top of one another to form the low index metamaterial 110. In this aspect, the dielectric layers with the vias 315 may be bonded together to form the low index metamaterial 110 using epoxy or other adhesive.

Figure 7:
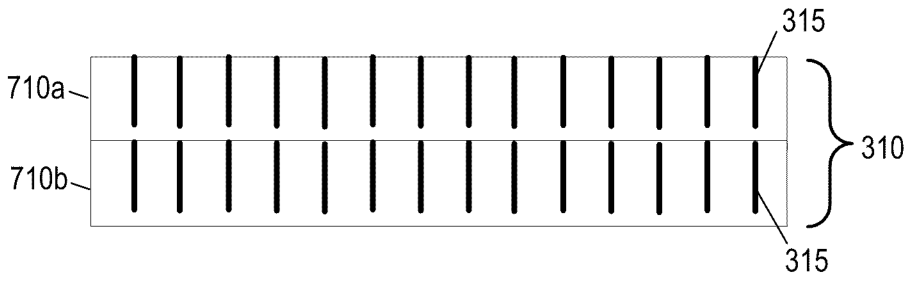
FIG. 7 shows an example of a multi-layer low index metamaterial according to aspects of the disclosure.

The vias 315 in adjacent dielectric layers may be spaced apart by the adhesive. The vias 315 in adjacent dielectric layers may also be spaced apart by having the vias for each dielectric layer penetrate partly through the respective dielectric layer. The dielectric layers may then be stacked so that the vias 315 of adjacent dielectric layers do not touch. An example of this is shown in FIG. 7, in which each of two dielectric layers 710*a* and 710*b* has vias 315 that penetrate partly through the respective dielectric layer 710 and 710*b*. In this example, the two dielectric layers 710*a* and 710*b* are stacked together such that their vias 315 do not touch.

Figure 8:
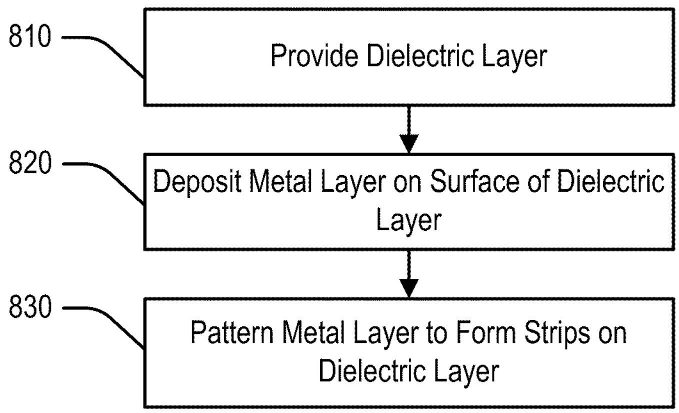
FIG. 8 is a flow diagram illustrating a method for fabricating a low index metamaterial according to another aspect of the disclosure.

FIG. 8 is a flow diagram of a process for fabricating a low index metamaterial 110 with strips 415 according to an aspect of the disclosure.

In step 810, a dielectric layer is provided. The dielectric layer may comprise polyethylene, polystyrene, Teflon, alumina or other dielectric material. In step 820, a metal layer is deposited on a surface of the dielectric layer. The metal layer may be deposited on the dielectric layer using chemical vapor deposition, electroplating or other techniques. In step 830, the metal layer on the surface of the dielectric layer is patterned to form the strips 415 on the surface of the dielectric layer. The metal layer may be patterned by placing a mask defining a desired pattern on the surface of the material layer and etching away areas of the material layer exposed by the mask with a chemical etchant. The strips 415 may be formed on one or both surfaces of dielectric layer. The strips 415 may be formed on the dielectric layer using techniques similar to those used to form metal traces on a printed circuit board.

Figure 9:
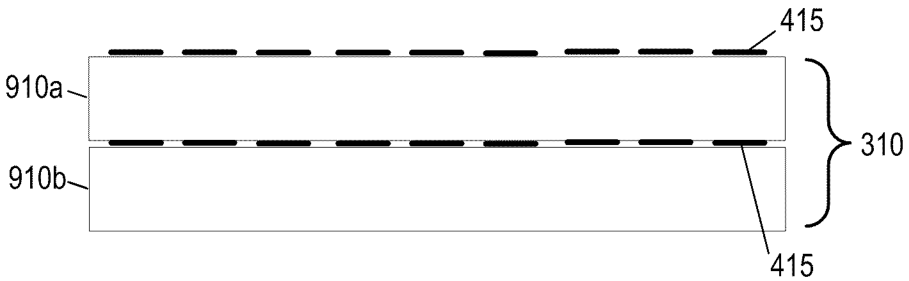
FIG. 9 show an example of a multi-layer low index metamaterial according to another aspect of the disclosure.

In one aspect, a single dielectric layer with the strips 415 fabricated using the process in FIG. 8 may be used for the low index metamaterial 110. In another aspect, a plurality of dielectric layers with strips 415 fabricated using the process of FIG. 8 may be stacked on top of one another and bonded together with an adhesive to form the low index metamaterial 110. An example of this is shown in FIG. 9, in which two dielectric layers 910*a* and 910*b* with strips are bonded together to form the low index metamaterial 110. The resulting metamaterial 110 includes strips 415 embedded in the dielectric layer 310 of the metamaterial.

A low index metamaterial 110 having both vias 315 and strips 415 may be fabricated using a combination of the steps in FIGS. 6 and 8. For example, after holes are formed in the dielectric layer in step 620, the metal may be deposited in the holes to form the vias 315 and on a surface of the dielectric layer. The metal on the surface of the dielectric layer may then be patterned to form strips 415 on the surface of the dielectric layer.

After fabrication, the low index metamaterial 110 may be used as a liner for a waveguide, a horn, a spatial combiner or other devices. For a soft boundary liner, the low index metamaterial 110 may be attached to an inner wall of a waveguide or horn. For a hard boundary liner, a combination of the low index metamaterial 110 and a dielectric layer 215 overlaying the low index metamaterial 110 may be attached to the inner wall of the waveguide or horn. The low index metamaterial 110 may be attached to the inner wall using an adhesive or other techniques. The dielectric layer 215 may be attached to the low index metamaterial 110, e.g., using an adhesive, to form the hard boundary liner. Prior to placement in a waveguide or horn, the soft or hard boundary liner may be cut into shape to match the shape of an inner wall of the waveguide or horn.

The low index metamaterial 110 according to various aspects of the disclosure may be used as liners in horn antennas to realize both soft and hard horn antennas.

Figure 10A:
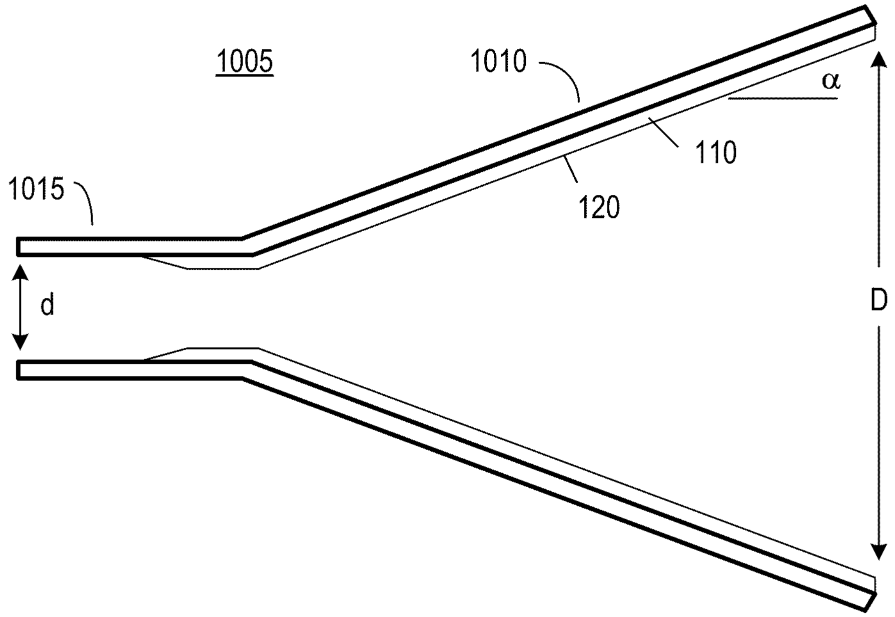
FIG. 10A shows an axial cross-sectional view of a soft horn according to an aspect of the disclosure.

FIG. 10A shows an axial cross-sectional view of a soft horn 1005 according to an aspect of the disclosure. The soft horn 1005 includes a conducing horn wall 1010 extending from a throat region 1015. The horn wall 1010 extends from the throat region 1015 at a flare angle of α to define an aperture having a diameter of D. The horn wall 1010 may have a circular, hexagonal, rectangular, elliptical or other cross-sectional shape perpendicular to the view shown in FIG. 10A. The throat region 1015 has a diameter of d.

In this aspect, the low index metamaterial 110 is used as a soft boundary liner on the inner surface of the horn wall 1010 to form a soft boundary 120 within the soft horn 1005. The resulting soft boundary may form a tapered aperture distribution in the soft horn 1005. In one aspect, the low index metamaterial 110 may cover substantially the entire inner surface of the horn wall 1010. In another aspect, the low index metamaterial 110 may cover two opposite sides of a rectangular horn antenna.

Figure 10B:
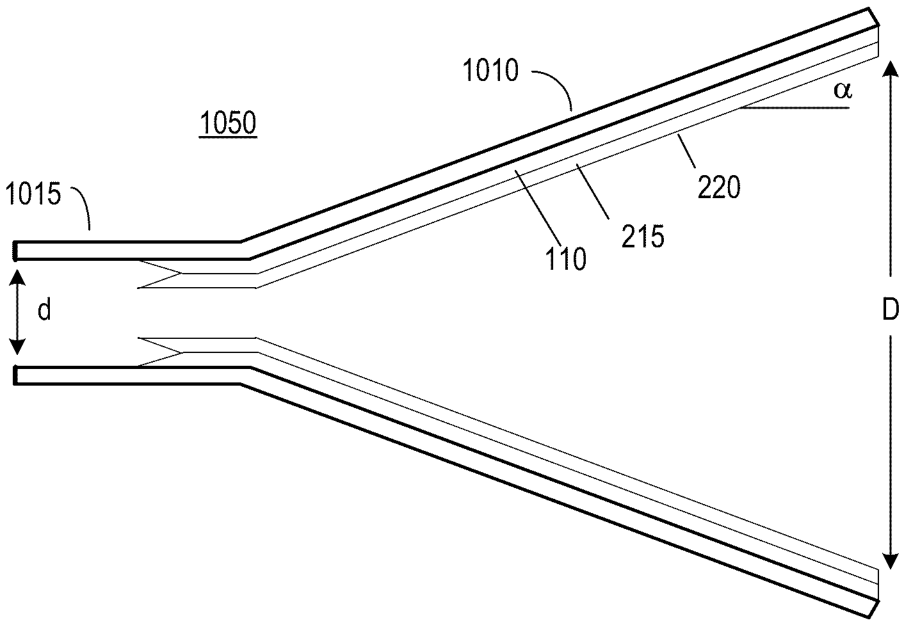
FIG. 10B shows an axial cross-sectional view of a hard horn according to an aspect of the disclosure.

FIG. 10B shows a cross-sectional view of a hard horn 1050 according to an aspect of the disclosure. The hard horn 1050 comprises a conducting horn wall 1010 and a throat region 1015 similar to the horn shown in FIG. 10A. In this aspect, a combination of the low index metamaterial 110 and a dielectric layer 215 is used as a hard boundary liner on the inner surface of the horn wall 1010 to form a hard boundary 220 within the hard horn 1050. The dielectric layer 215 overlays the low index metamaterial 110 and has a dielectric constant greater than one. The resulting hard boundary may form a uniform aperture distribution within the hard horn 1050 for providing high directivity and gain.

Examples of balanced hybrid-mode soft and hard horns will now be described below with reference to FIGS. 10A and 10B. As discussed below, the hybrid-mode soft horns can provide polarization independent patterns and low cross-polarization over a relatively wide frequency band. The horns may be used as horn feeds for reflector antennas, horn antennas for phased antenna arrays and other applications.

Referring to FIG. 10A, in one example, a soft horn 1005 has a throat diameter of d=48.8 millimeters (mm), an aperture diameter of D=400 mm, a flare angle of α=14° and a circular cross-section. The low index metamaterial 110 has a thickness of about 11.9 mm and a dielectric constant of about 0.5. The soft horn 1005 in this example may be used for C-band operating frequencies (3.4-6.725 GHz).

Referring to FIG. 10B, in a second example, a hard horn 1050 according to one aspect has a throat diameter of d=18 mm, an aperture diameter of D=80 mm, a flare angle of α=7.5° and a circular cross-section. The low index metamaterial 110 has a thickness of about 2.7 mm and a dielectric constant of about 0.7. The dielectric layer 215 overlaying the low index metamaterial 110 has a thickness of about 1.8 mm and a dielectric constant of about 3. The hard horn 1050 in this example may be used for Ku-band operating frequencies.

Figure 11:
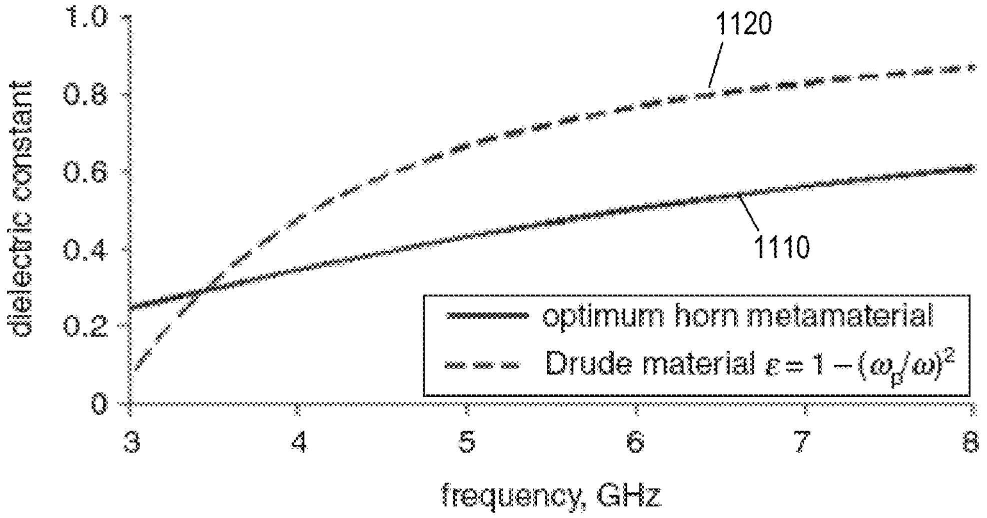
FIG. 11 is a plot showing an optimal dispersion curve for a soft horn supporting balanced hybrid mode over a frequency band and a Drude dispersion curve with $\omega_p$=2.9 GHz.

A moment method model (WIPL-D) for the soft horn 1005 in the above example was used to generate an optimal dispersion curve corresponding to minimum cross-polarization at each computed frequency. FIG. 11 shows a plot of the optimal dispersion curve 1110 for the soft horn 1005 from 3 GHz to 8 GHz. As shown in FIG. 11, the optimal dispersion curve 1110 monotonically increases with frequency. FIG. 11 also shows a Drude dispersion curve, which simulates typical electromagnetic behavior in dense or nanoscale media. In this example, the Drude dispersion 1120 was used to simulate the frequency dispersion of the low index metamaterial 110.

Figure 12:
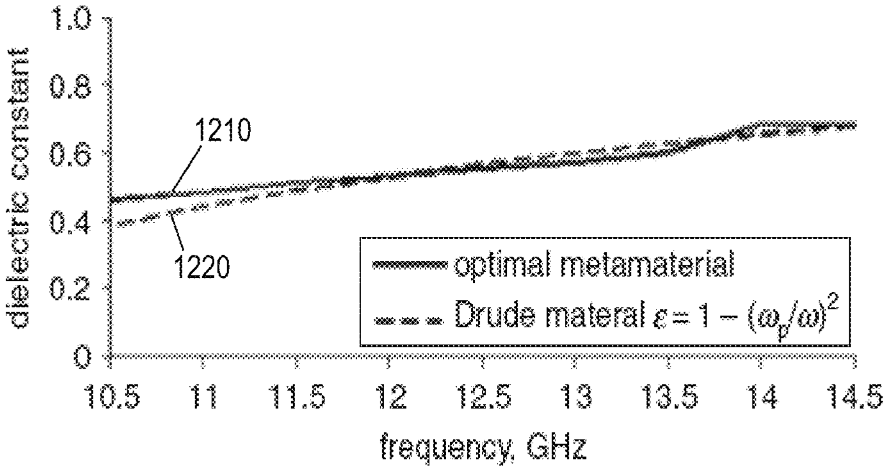
FIG. 12 is a plot showing an optimal dispersion curve for a hard horn supporting balanced hybrid mode with maximal directivity and −30 dB relative cross-polarization over a frequency band and a Drude dispersion curve with $\omega_p$=8.25 GHz.

Similarly, a WIPL-D for the hard horn 1050 in the above example was used to generate an optimal dispersion curve with an objective of maximum aperture efficiency while maintaining a cross-polarization at −30 dB. FIG. 12 shows a plot of the optimal dispersion curve 1210 for the hard horn 1050 from 10.5 GHz to 14.5 GHz. As shown in FIG. 11, the optimal dispersion curve 1210 monotonically increases and matches the Drude dispersion curve 1220 very well. For both horns 1005 and 1050, the qualitative agreement between the optimal and the Drude dispersion curves indicates that the horns 1005 and 1050 can achieve broadband performance.

Figure 13A:
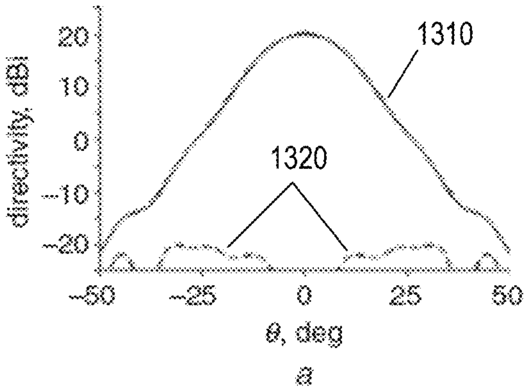
FIGS. 13A and 13B show WIPL-D computed co-polarization and cross-polarization for a soft horn at 45° phi-cut at frequencies of 3.4 GHz and 6.725 GHz, respectively.
Figure 13B:
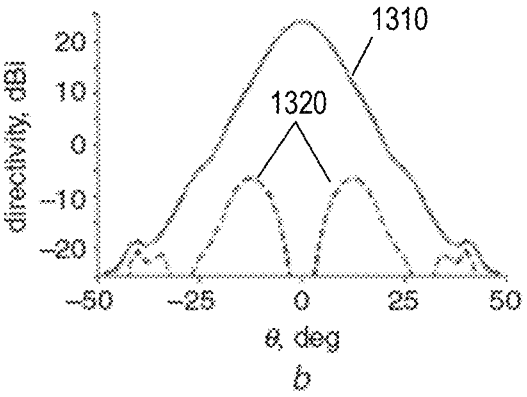

FIGS. 13A and 13B shows co-polarization and cross-polarization radiation patterns for the soft horn 1005 in the above example computed by WIPL-D at the low and high frequencies of the extended C-band. FIG. 13A shows the co-polarization 1310 and cross-polarization 1320 radiation patterns at a frequency of 3.4 GHz. FIG. 13B shows the co-polarization 1310 and cross-polarization 1320 radiation patterns at a frequency of 6.725 GHz. The metamaterial permittivity at each frequency was taken from the soft dispersion curve in FIG. 11. As shown in FIGS. 13A and 13B, the relative peak cross-polarization was under −30 dB for the entire C-band, allowing metamaterial horns to replace corrugated horns. In fact, the bandwidth of the horn in this example is much wider than the 2:1 frequency band, which is the limit for a typical corrugated horn. Also, metamaterial horns can replace trifurcated horns by applying metamaterials on the E-plane walls.

Figure 14A:
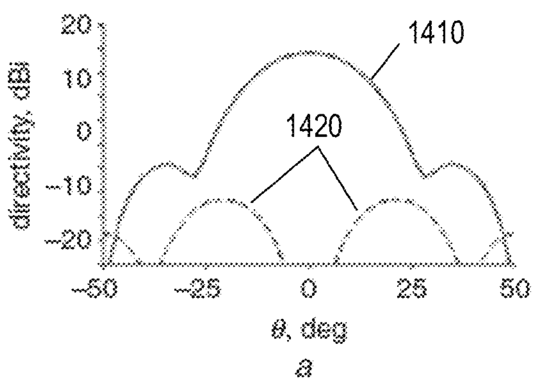
FIGS. 14A and 14B show WIPL-D computed co-polarization and cross-polarization for a hard horn at 45° phi-cut at frequencies of 12.0 GHz and 14.5 GHz, respectively.
Figure 14B:
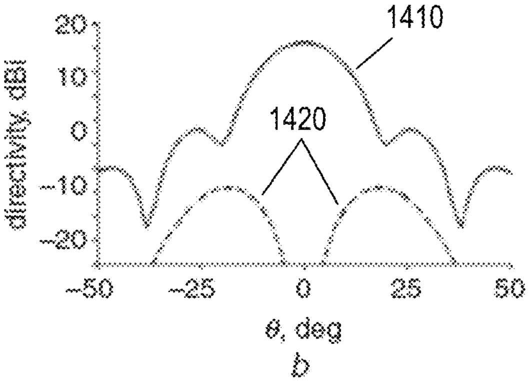

FIGS. 14A and 14B shows co-polarization 1410 and cross-polarization 1420 radiation patterns for the hard horn 1050 in the above example computed by WIPL-D at frequencies of 12.0 and 14.5 GHZ, respectively, assuming a metamaterial permittivity corresponding to the hard dispersion curve in FIG. 12.

Figure 15:
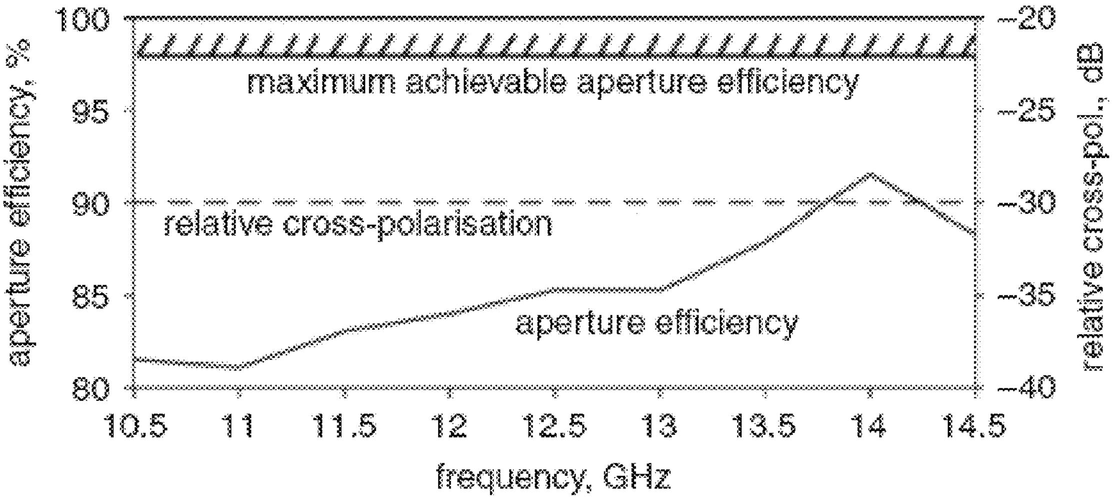
FIG. 15 shows WIPL-D computed aperture efficiency and relative cross-polarization versus frequency for a hard horn according to an aspect of the disclosure.

FIG. 15 shows computed aperture efficiency and cross-polarization against frequency for the hard horn 1050, assuming the permittivity dispersion curve from FIG. 12. Theoretical aperture efficiency or uniform amplitude distribution is 98% owing to non-uniform phase distribution from the 7.5° flare angle. The curves demonstrate aperture efficiency greater than 82/85% and relative peak cross-polarization under −30 dB over 20/15% band, which is almost twice the bandwidth of known hard horns.

Thus, the soft horn 1005 using low index metamaterial 110 can achieve cross-polarization under −30 dB over the extended C-band. The hard horn 1050 using low index metamaterial 110 can achieve cross-polarization under −30 dB and aperture efficiency over 80% (84% relative to maximum achievable efficiency) over a 25% band. The soft and hard horns 1005 and 1050 may be used in open electromagnetic bandgap structures and other applications.

Figure 16A:
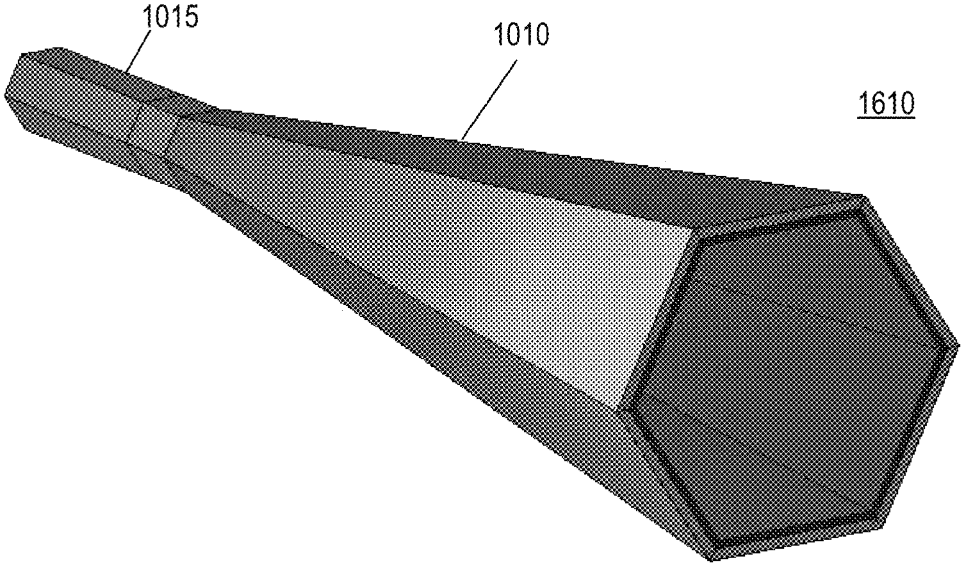
FIG. 16A shows a hexagonal horn according to an aspect of the disclosure.

Although the soft and hard horns 1005 and 1050 in the above example have circular cross-sections, soft and hard horns according to aspects of the disclosure may have other cross-sectional shapes. For example, FIG. 16A shows a perspective view of a hexagonal horn 1610 according to an aspect of the disclosure. In this example, both the horn wall 1010 and throat region 1015 of the hexagonal horn 1610 may have a hexagonal cross-section. The hexagonal horn 1610 may be lined with the low index material 110 to realize a soft-hexagonal horn or lined with a combination of the low index metamaterial 110 and a dielectric layer 215 overlaying the low index metamaterial 110 to realize a hard-hexagonal horn. Similar to the hard-circular horn discussed above, the hard-hexagonal horn 1610 can achieve high aperture efficiencies and low cross-polarization over a wide frequency band.

Figure 16B:
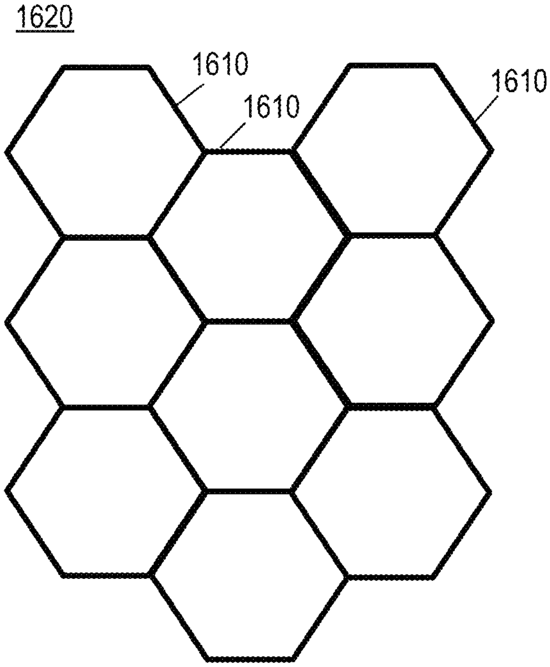
FIG. 16B shows an array of hexagonal horns according to an aspect of the disclosure.

The hexagonal horn 1610 allows for greater array packaging efficiency. For example, FIG. 16B shows a front view of an array 1620 of hexagonal horns 1610. As shown in FIG. 16B, the hexagonal horns 1610 allows the horns 1610 to be tightly packed in an array. In this example, the array 1610 of hexagonal horns 1610 may be used as feed horns in a reflector antenna comprises a reflector dish directing electromagnetic waves toward the feed horns. The hexagonal horn 1610 also has flat inner surfaces, which allow for the use of flat low index materials 110 as liners for the horn.

In one aspect, the dielectric layer 215 overlaying the low index material 110 may also be a metamaterial. In this aspect, the metamaterial of the dielectric layer 215 may comprise a layer of dielectric material with embedded vias and strips, in which the vias and strips are made of one or more different dielectric materials that are different from the layer of dielectric material. The vias and strips may have the similar structures as those shown in FIGS. 3-5 and may be formed using similar techniques as those used for the vias 315 and strips 415 of the low index metamaterial 110. In this aspect, the metamaterial of the dielectric layer 215 may have frequency dispersive properties (i.e., dielectric constant that varies with frequency), which may be adjusted by varying the dimensions, arrangement and/or materials of the vias and/strips. In this aspect, the dispersive properties of both the metamaterial of the dielectric layer 215 and the low index metamaterial 110 may be independently adjusted to better match the frequency dispersion curve of the hard boundary liner with the optimal dispersion curve of the horn.

Figure 17:
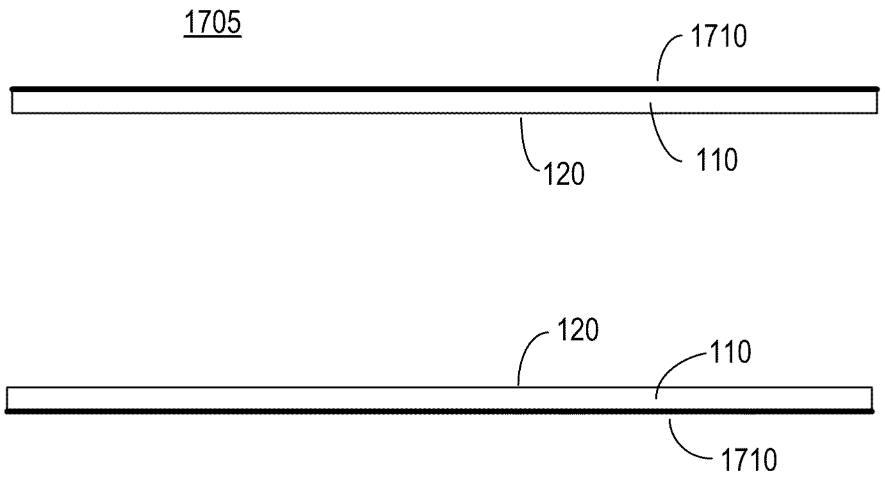
FIG. 17 shows a soft waveguide comprising a low index metamaterial according to an aspect of the disclosure.

FIG. 17 shows an axial cross-sectional view of a soft waveguide 1705 with a soft boundary liner according to an aspect of the disclosure. The soft waveguide 1705 comprises a conducting wall 1710 and a layer of low index metamaterial 110 lining the inner surface of the conducing wall 1710. The low index metamaterial 110 may comprise any of the metamaterials according to various aspects of the disclosure. The surface or boundary of the low index metamaterial 110 forms a soft boundary 120 with air.

Figure 18A:
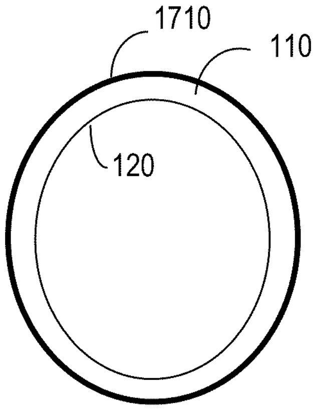
FIGS. 18A and 18B show examples of different cross-sectional shapes for the soft waveguide in FIG. 17 according to aspects of the disclosure.
Figure 18B:
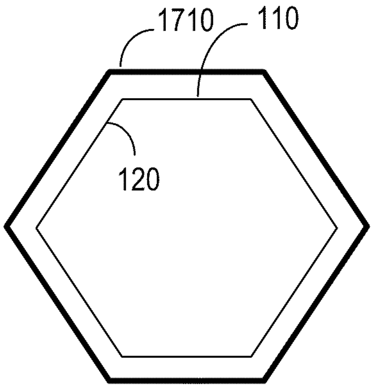

The soft waveguide 1705 may have a variety of cross-sectional shapes. For example, the cross-sectional shape of the soft waveguide 1705 may be circular or hexagonal as shown in FIGS. 18A and 18B, respectively. Other cross-sectional shapes may be used as well including rectangular and elliptical cross-sections.

Figure 19:
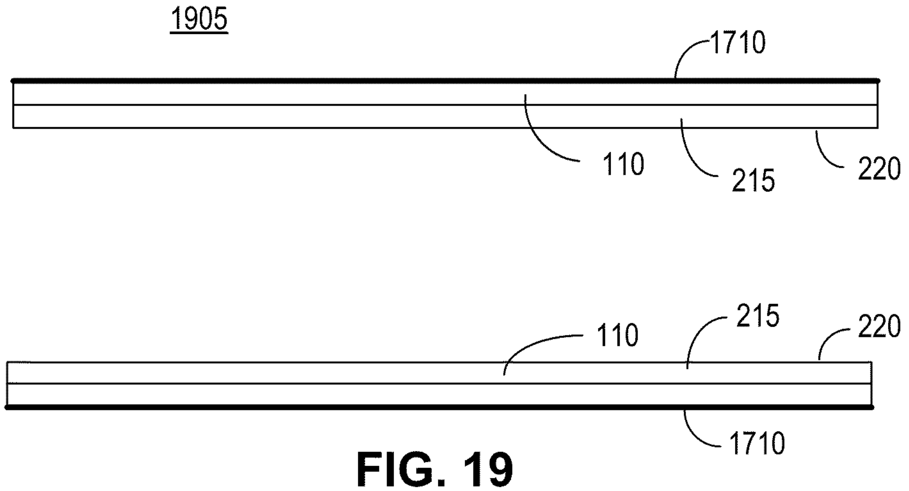
FIG. 19 shows a hard waveguide comprising a low index metamaterial according to an aspect of the disclosure.

FIG. 19 shows an axial cross-sectional view of a hard waveguide 1905 according to an aspect of the disclosure. The hard waveguide 1905 comprises a conducting wall 1710 and an hard boundary liner lining the conducting wall 1710. The hard boundary liner comprises a layer of low index metamaterial 110 and a dielectric layer 215 overlaying the low index metamaterial 110. The low index metamaterial 110 may comprise any of the metamaterials according to various aspects of the disclosure. The dielectric layer 215 has a dielectric constant greater than one. The surface or boundary of the dielectric layer 215 forms a hard boundary 220 with air.

Figure 20A:
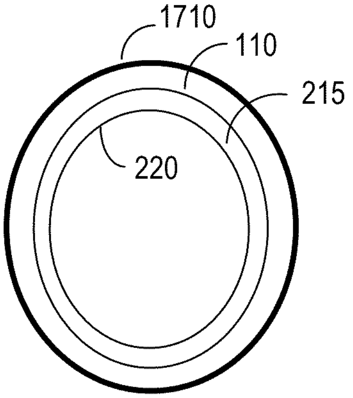
FIGS. 20A and 20B show examples of different cross-sectional shapes for the hard waveguide in FIG. 19 according to aspects of the disclosure.
Figure 20B:
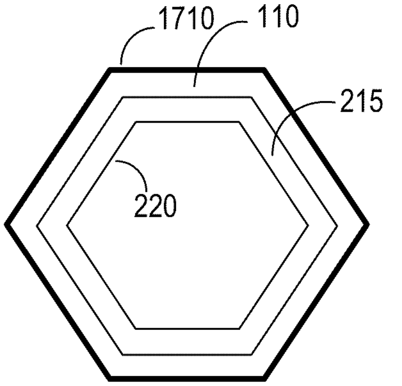

The hard waveguide 1905 may have a variety of cross-sectional shapes. For example, the cross-sectional shape of the soft waveguide 1905 may be circular or hexagonal as shown in FIGS. 20A and 20B, respectively. Other cross-sectional shapes may be used as well including rectangular and elliptical cross-sections.

In various aspects of the disclosure, the low index metamaterial 110 may be used to provide RF isolation between two or more RF devices (e.g., antennas or RF circuitry). In these aspects, a low index metamaterial 110 may be placed on a surface between the RF devices to form a soft boundary 120 between the RF devices. The soft boundary 120 suppresses electric fields at the soft boundary, thereby providing an RF isolation barrier between the RF devices.

Figure 21:
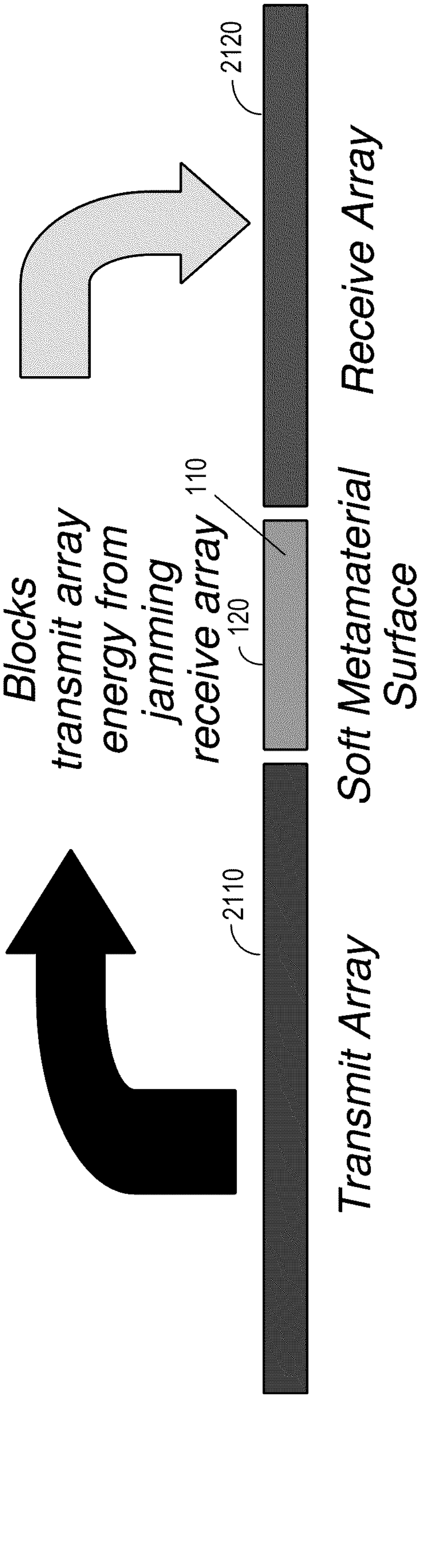
FIG. 21 shows a transmit antenna array and a receive antenna array isolated by a low index metamaterial according to an aspect of the disclosure.

FIG. 21 shows an example in which a low index metamaterial 110 is placed between a transmit antenna array 2110 and a receive antenna array 2120. Each antenna array 2110 and 2120 may comprise an array of antenna elements, which may steered, e.g., by varying the relative phases of the antenna elements. In this example, the low index metamaterial 110 forms a soft boundary 120 that provides an RF isolation barrier between the two antenna arrays 2110 and 2120. The resulting RF isolation barrier prevents RF energy from the transmit antenna array 2110 from jamming the receive antenna array 2120.

Figure 22:
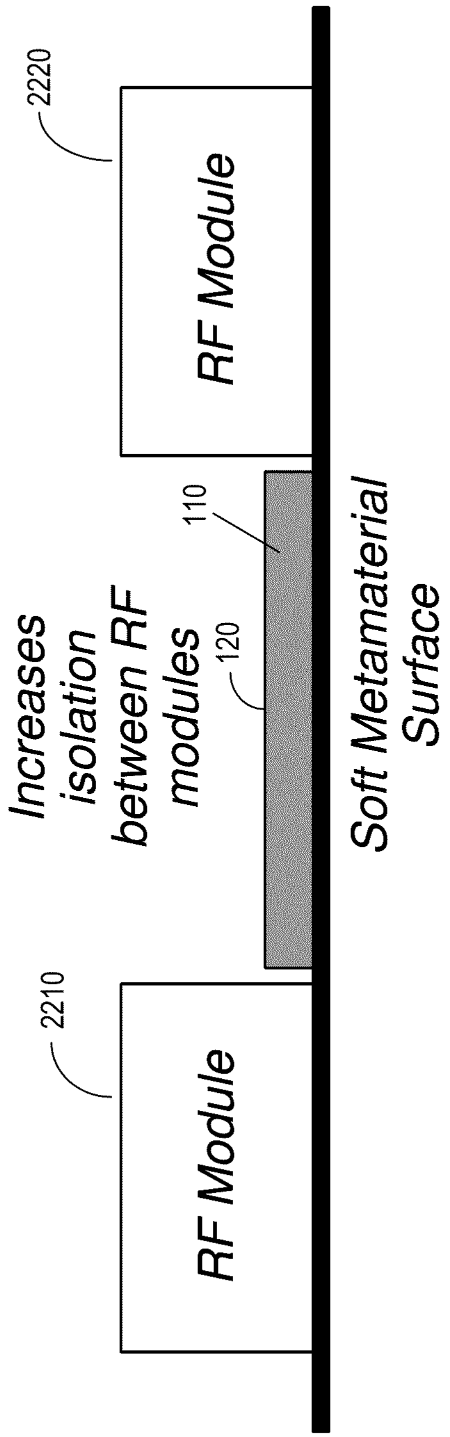
FIG. 22 shows two RF modules isolated from each other by a low index metamaterial according to an aspect of the disclosure.

FIG. 22 shows an example in which the low index metamaterial 110 is placed between two RF modules 2210 and 2220. The RF modules 2210 and 2220 may include low noise amplifiers, RF transmitters, RF receivers and other RF circuitry. In this example, the low index metamaterial 110 forms a soft boundary 120 that provides an RF isolation barrier between the two RF modules 2210 and 2220, which prevents the RF modules 2210 and 2220 from interfering with one another.

In various aspects of the disclosure, the low index metamaterial 110 may be used to form a hard boundary with a low radar cross-section for making an object invisible to radar.

Figure 23A:
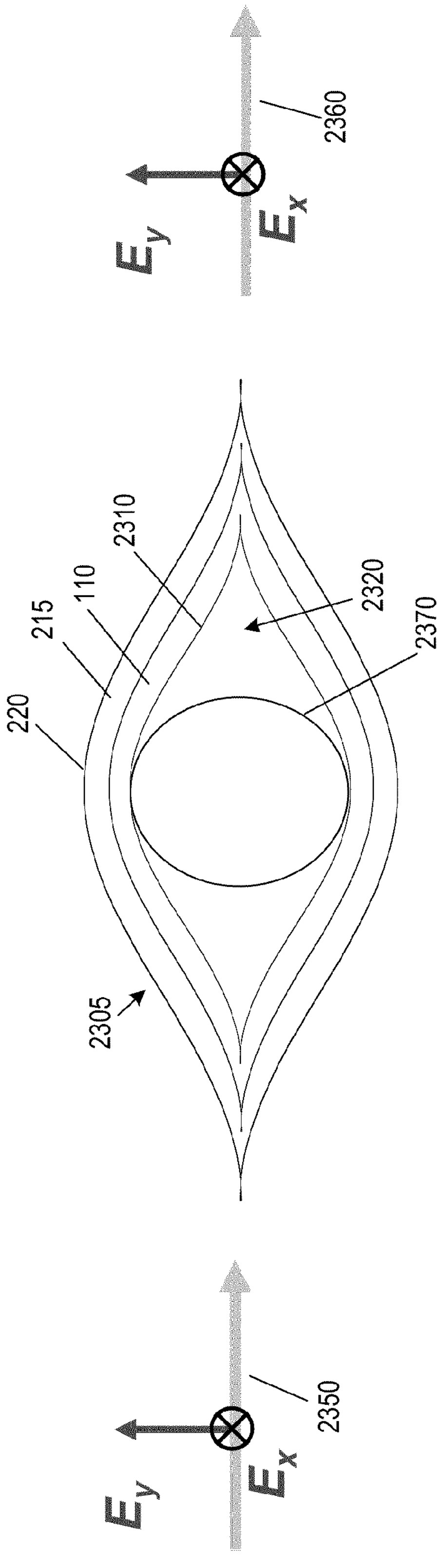
FIGS. 23A and 23B show examples of hard boundaries with reduced radar cross-sections according to aspects of the disclosure.
Figure 23B:
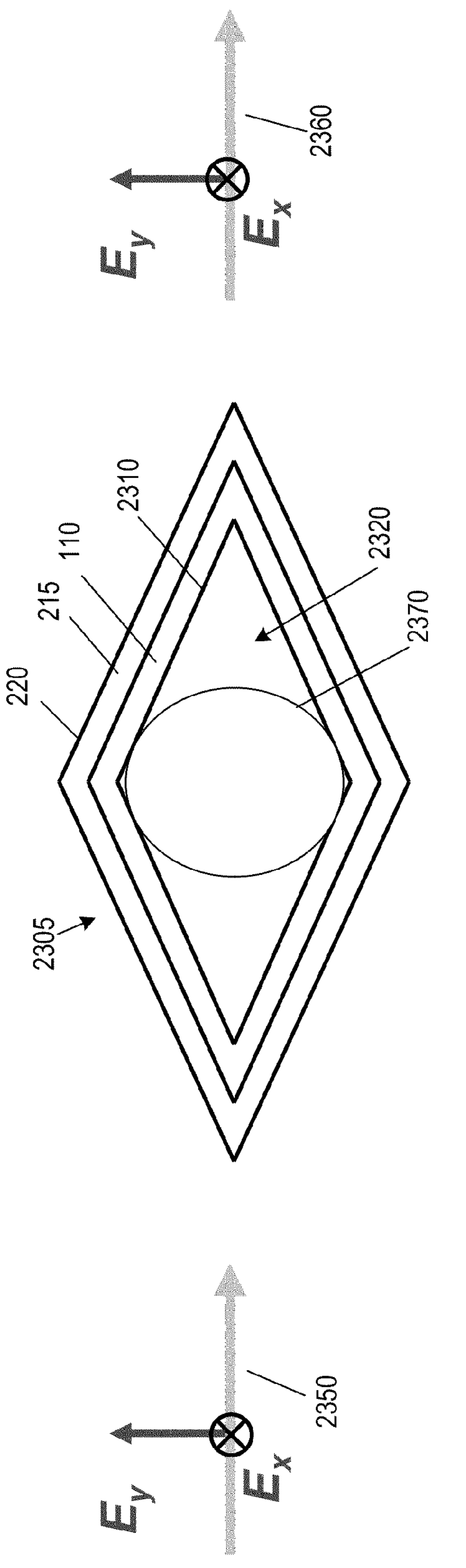

FIG. 23A shows a cross-sectional view of a hard boundary liner 2305 for making an object invisible to radar. The hard boundary liner 2305 includes a metal surface 2310, low index metamaterial 110 overlying the metal surface 2310 and a dielectric layer 215 overlaying the low index metamaterial 110. The low index metamaterial 110 and dielectric layer 215 form the hard boundary 220 having a low radar cross-section. FIG. 23 shows an example of a planar electromagnetic wave 2350 from a radar propagating from left to right. The electromagnetic wave 2350 incident on the hard boundary 220 propagates along the surface of the hard boundary 220. In this example, the electromagnetic wave 2360 leaving the hard boundary 220 propagates in approximately the same direction as the incident wave 2350. As a result, little or none of the incident electromagnetic wave 2350 is reflected back to the radar.

The hard boundary liner 2305 forms an interior space 2320, in which an object 2370 to be hidden from the radar may be placed. The object 2370 may be part of an aircraft, missile vehicle or any other objects to be hidden from the radar. The object 2370 within the hard boundary liner 2305 may provide structural support for the hard boundary liner 2305 and may be attached to the hard boundary liner 2305 using various techniques (e.g., adhesive). Although the object 2370 is shown having a circular cross-section, the object 2370 may have any shape that can be accommodated within the hard boundary liner 2305. Further, the metal surface 2310 may be part of the object 2370.

The hard boundary liner 2305 may have various cross-sectional shapes. For example, the hard boundary liner 2305 may have a curved eye-shape, as shown in the example in FIG. 23A or a trapezoidal shape, as shown in the example in FIG. 23B. The hard boundary 2305 may have other cross-section shapes including circular and hexagonal cross-sections. The hard boundary liner 2305 shown in FIGS. 23A and 23B may extend along a direction perpendicular to FIGS. 23A and 23B, respectively.

Figure 24:
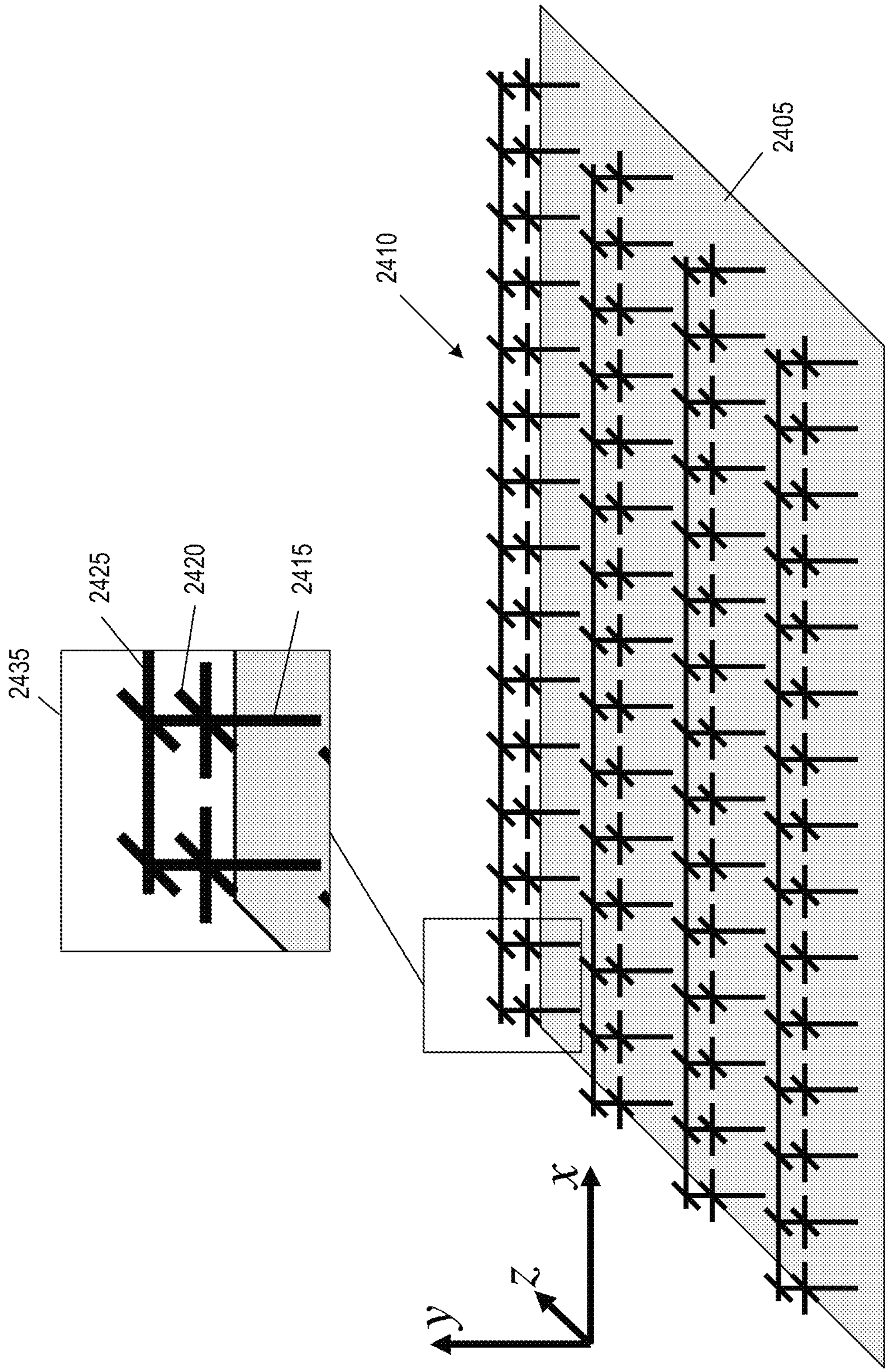
FIG. 24 shows an example of a low index metamaterial having a free standing structure according to an aspect of the disclosure.

FIG. 24 shows a perspective view of a low index metamaterial 2410 according to an aspect of the disclosure. In this aspect, the low index metamaterial 2410 may comprise a free-standing three-dimensional grid structure of interconnected wires with no dielectric layer 310. The wires may comprise metal or other conductive material. The low index metamaterial 2410 may be attached to a conducting surface 2405 (e.g., conducting horn wall).

The grid structure of the low index metamaterial 2410 may comprise wires 2415 orientated normal to the conducting surface 2405 and wires 2420 and 2425 orientated parallel to the conducting surface 2405, as shown in the enlarged view 2435. In the example shown in FIG. 24, the wires 2415 orientated normal to the conducting surface 2405 are attached at one end to the conducting surface 2405. The wires 2415 may be attached to the conducting surface 2405 by adhesives, screws, welding or other techniques. The wires 2420 and 2425 orientated parallel to the conducting surface 2405 may be attached to the wires 2415, which provide structural support for the wires 2420 and 2425 above the conducting surface 2405. The wires 2420 and 2425 may be attached to the wires 2415 and/or one another by adhesives, screws, welding or other techniques.

In one aspect, the low index metamaterial 2410 may have a repeating wire structure that comprises a cell that is repeated throughout or a portion of the low index metamaterial 2410.

In one aspect, each of the wires 2415, 2420 and 2425 may have a dimension in the direction of propagation of an electromagnetic wave that is smaller than a wavelength of a frequency of operation. For example, when the low index metamaterial 2410 is used as a liner for a waveguide or horn, each of the wires may have a dimension in the direction of propagation that is smaller than the wavelength of the maximum frequency of operation of the waveguide or horn. In one aspect, the dimension may be 1/10 or less the wavelength of the maximum frequency of operation. In the example shown in FIG. 24, the direction of propagation of the electromagnetic wave may be along the z axis.

As a result of the small dimension in the direction of propagation, the grid structure of the low index metamaterial 2410 appears as a medium having a low dielectric constant (i.e., $0<\in_r<1$) with respect to an electromagnetic wave at the frequency of operation. The dielectric constant of the metamaterial 2410, as seen by the electromagnetic wave, may be a function of the dimensions and/or arrangement of the wires 2415, 2420 and 2425.

The metamaterial 2410 may have a dielectric constant that varies along a direction normal to the conducting surface 2405. This may be accomplished by varying the dimensions and/or arrangement of the wires 2415, 2420 and 2425 along the direction normal to the conducting surface. In the example shown in FIG. 24, the grid structure may include wires 2415, 2420 and 2425 orientated in the x, y and z directions to affect all electric field components of an electromagnetic wave.

The metamaterial 2410 may be used to form a soft boundary or a hard boundary by placing a dielectric layer having an dielectric constant greater than one over the metamaterial 2410. The metamaterial 2410 may be used in a soft and/or hard boundary liner for a horn, waveguide, RF isolation barrier, or other applications.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

In one aspect, the term "element(s)" may refer to a component(s). In another aspect, the term "element(s)" may refer to a substance(s). In yet another aspect, the term "element(s)" may refer to a compound(s).

Terms such as "top," "bottom," "front," "rear" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an aspect may refer to one or more aspects and vice versa. A phrase such as an "aspect" does not imply that such aspect is essential to the subject technology or that such aspect applies to all configurations of the subject technology. A disclosure relating to an aspect may apply to all aspects, or one or more aspects. An aspect may provide one or more examples of the disclosure. A phrase such an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such a configuration may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A low index metamaterial, comprising:

a dielectric layer; and a plurality of conductors on a surface of the dielectric layer, embedded in the dielectric layer or both, so as to form the low index metamaterial;

wherein the low index metamaterial appears as a medium having a dielectric constant greater than zero and less than one with respect to electromagnetic waves at predetermined frequencies, the electromagnetic waves propagating at grazing angles with respect to a surface of the low index metamaterial.

2. The low index metamaterial of claim 1, wherein the plurality of conductors comprises a plurality of vias embedded in the dielectric layer.

3. The low index metamaterial of claim 2, wherein the plurality of conductors comprises a plurality of strips on the surface of the dielectric layer.

4. The low index metamaterial of claim 2, wherein the plurality of conductors comprises a plurality of strips embedded in the dielectric layer.

5. The low index metamaterial of claim 4, wherein the plurality of strips are orientated parallel to the surface of the dielectric layer.

6. The low index metamaterial of claim 1, wherein the plurality of conductors comprises a plurality of strips on the surface of the dielectric layer.

7. The low index metamaterial of claim 1, wherein the plurality of conductors comprises a plurality of strips embedded in the dielectric layer.

8. The low index metamaterial of claim 7, wherein the plurality of strips are orientated parallel to the surface of the dielectric layer.

9. The low index metamaterial of claim 1, wherein the dielectric constant of the low index metamaterial varies along one or more directions.

10. A hard boundary liner, comprising:

a low index metamaterial, the low index metamaterial comprising:

a first dielectric layer; and a plurality of conductors on a surface of the dielectric layer, embedded in the first dielectric layer or both;

wherein the low index metamaterial appears as a medium having a dielectric constant greater than zero and less than one with respect to electromagnetic waves at predetermined frequencies, the electromagnetic waves propagating at grazing angles with respect to a surface of the low index metamaterial; and a second dielectric layer overlaying the low index metamaterial.

11. The hard boundary liner of claim 10, wherein the plurality of conductors comprises a plurality of vias embedded in the first dielectric layer.

12. The hard boundary liner of claim 11, wherein the plurality of conductors comprises a plurality of strips orientated parallel to the surface of the first dielectric layer.

13. The hard boundary liner of claim 10, wherein the plurality of conductors comprises a plurality of strips orientated parallel to the surface of the first dielectric layer.

14. The hard boundary liner of claim 10, wherein the second dielectric layer comprises a second metamaterial.

15. The hard boundary liner of claim 10, wherein the dielectric constant of the low index metamaterial varies alone one or more directions.

16. A low index metamaterial, comprising:

a plurality of interconnected wires forming a free-standing three-dimensional grid structure so as to form the low index metamaterial;

wherein the low index metamaterial appears as a medium having a dielectric constant greater than zero and less than one with respect to electromagnetic waves at predetermined frequencies, the electromagnetic waves propagating at grazing angles with respect to a surface of the low index metamaterial.

17. The low index metamaterial of claim 16, wherein the plurality of wires includes wires orientated along two orthogonal directions.

18. The low index metamaterial of claim 16, wherein the plurality of wires includes wires orientated along three orthogonal directions.

19. The low index metamaterial of claim 16, wherein the dielectric constant of the low index metamaterial varies along one or more directions.

* * * * *